United States Patent
Liaw

(10) Patent No.: US 7,187,036 B2
(45) Date of Patent: Mar. 6, 2007

(54) CONNECTION STRUCTURE FOR SOI DEVICES

(75) Inventor: Jhon Jhy Liaw, Hsin-Chu (TW)

(73) Assignee: Taiwan Semiconductor Manufacturing Company, Hsin-Chu (TW)

(*) Notice: Subject to any disclaimer, the term of this patent is extended or adjusted under 35 U.S.C. 154(b) by 0 days.

(21) Appl. No.: 10/815,201

(22) Filed: Mar. 31, 2004

(65) Prior Publication Data

US 2005/0224877 A1    Oct. 13, 2005

(51) Int. Cl.
H01L 29/76  (2006.01)
H01L 29/94  (2006.01)
H01L 31/062  (2006.01)
H01L 31/113  (2006.01)
H01L 31/119  (2006.01)

(52) U.S. Cl. .................. 257/347; 257/336; 257/344; 257/412; 257/413; 257/E27.098; 257/E21.661

(58) Field of Classification Search ................ 257/343, 257/347, 365, 270, E29.064, E21.537, E29.156, 257/336, 344, 412, 413, E27.098, E21.661
See application file for complete search history.

(56) References Cited

U.S. PATENT DOCUMENTS

| | | | | |
|---|---|---|---|---|
| 4,569,122 A | * | 2/1986 | Chan | 438/385 |
| 5,187,114 A | * | 2/1993 | Chan et al. | 438/153 |
| 5,204,279 A | * | 4/1993 | Chan et al. | 438/153 |
| 5,298,782 A | * | 3/1994 | Sundaresan | 257/393 |
| 5,336,916 A | * | 8/1994 | Chan et al. | 257/377 |
| 5,795,800 A | * | 8/1998 | Chan et al. | 438/149 |
| 6,271,570 B1 | * | 8/2001 | Huang et al. | 257/382 |
| 6,436,744 B1 | * | 8/2002 | Bryant et al. | 438/151 |
| 6,512,299 B1 | * | 1/2003 | Noda | 257/774 |
| 6,724,085 B2 | * | 4/2004 | Tomita | 257/758 |
| 2003/0153136 A1 | * | 8/2003 | Matsumoto et al. | 438/151 |
| 2004/0185609 A1 | * | 9/2004 | Okumura et al. | 438/199 |
| 2004/0256732 A1 | * | 12/2004 | Liaw | 257/774 |

* cited by examiner

*Primary Examiner*—Kenneth Parker
*Assistant Examiner*—Jesse A. Fenty
(74) *Attorney, Agent, or Firm*—Duane Morris LLP

(57) ABSTRACT

A semiconductor contact connection structure and the method for forming the same are disclosed. The connection structure has a first semiconductor device formed on an insulator substrate. A non-conducting gate interconnect layer is formed on the insulator substrate for connecting to a gate of a second semiconductor device, and a silicide layer formed on the gate interconnect layer and an active region of the first semiconductor device for making a connection thereof.

18 Claims, 12 Drawing Sheets

CONNECTION STRUCTURE FOR SOI DEVICES

BACKGROUND

The present invention relates generally to semiconductor devices; and more particularly, to the contact structures for semiconductor devices. Still more particularly, the present invention relates to a device and process that uses sidewall butted connection and silicide bridge connection for reducing structure count, complexity, and size.

One type of basic semiconductor device is the CMOS static random access memory (SRAM) which retains its memory state without refreshing as long as power is supplied to the cells. In a typical SRAM, the memory is stored as a voltage differential within a bistable cell constructed of two cross-coupled inverters. Data is written into or read from the cell through two pass gate transistors oppositely biased by a bit line, and a bit bar line, and controlled by a word line. Each inverter is composed of a P-channel metal-oxide-semiconductor (MOS) field-effect-transistor (PMOS-FET) in series with an input/output (I/O) node, and an N-channel MOSFET (NMOSFET). The node of each inverter is connected to the gates of both transistors of the other inverter. An I/O transistor is connected from a bit line to the node of a first inverter. Another I/O transistor is connected from a bit line bar (always biased oppositely from the Bit line) to the node of a second inverter. In semiconductor memory designs, large memory count, stable data retention, and speed are valued. However, large memory count and complex structures add up to a large cell physical size, which results in higher fabrication expense and slower speed. As such, reducing structure count of contacts and their complexity is relevant.

Efficient integrated circuit chip layout of a standard six-transistor SRAM may minimize the area required. However, as the demand for more complex integrated circuits, smaller transistors and structures, and for faster and more reliable performance continues to grow, new approaches are needed. Even the contact structures occupy valuable area in memory cells. Therefore, reductions in contact count, complexity, and size are of paramount importance.

Silicon-on-insulator (SOI) is a structure of silicon structure in which a thin layer of insulating oxide is buried just below the top surface. A thin layer of single-crystal silicon above the oxide may then be used for the construction of semiconductor devices. These devices are typically isolated in individual islands of the aforesaid thin layer of single-crystal silicon. By constructing and separating circuit elements with no substrate connection, latch-ups may be avoided in CMOS devices. Also, junction capacitance may be reduced, thereby achieving higher speed.

For maximum density to be achieved in logic circuits and SRAM, the cells must be laid out in as small a size as possible. In nanometer technology, the SOI MOSFETs have been researched for high-speed, low-leakage and high-density products. In addition, SOI technology allows for a tighter design rule because of well isolation margins.

Desirable in the art of semiconductor devices are additional designs and cell layouts that utilize SOI technologies in tandem with other technologies to achieve reduction in contact count, complexity and size, thereby improving overall speed and performance.

SUMMARY

In view of the foregoing, this invention provides a circuit that reduces contact count, complexity and size.

In one example, a semiconductor contact connection structure and the method for forming the same are disclosed. The connection structure has a first semiconductor device formed on an insulator substrate. A non-conducting gate interconnect layer is formed on the insulator substrate for connecting to a gate of a second semiconductor device; and a silicide layer formed on the gate interconnect layer, and an active region of the first semiconductor device for making a connection thereof.

This improved contact structure efficiently and simply replaces a tungsten plug butted contact or a pair of contacts with a metal routing. This also eases the alignment tolerance for the contact. Various aspects and advantages will become apparent from the following detailed description, taken in conjunction with the accompanying drawings, illustrating the principles of the invention by way of examples.

DESCRIPTION

The present invention provides an improved method for the layout of a silicon-on-insulator (SOI) version of an integrated circuit (IC), and a contact/connection structure therein. Several examples will be illustrated using a Static Random Access Memory (SRAM) cell, but it is understood that the same technology can be used for other semiconductor devices.

As will be illustrated below, the present invention uses a polysilicon (poly) sidewall butted connection structure, between the gate poly and active area, to replace a butted contact or a tungsten plug butted contact, or two contacts with a metal routing layer in the semiconductor device.

Figure 1:
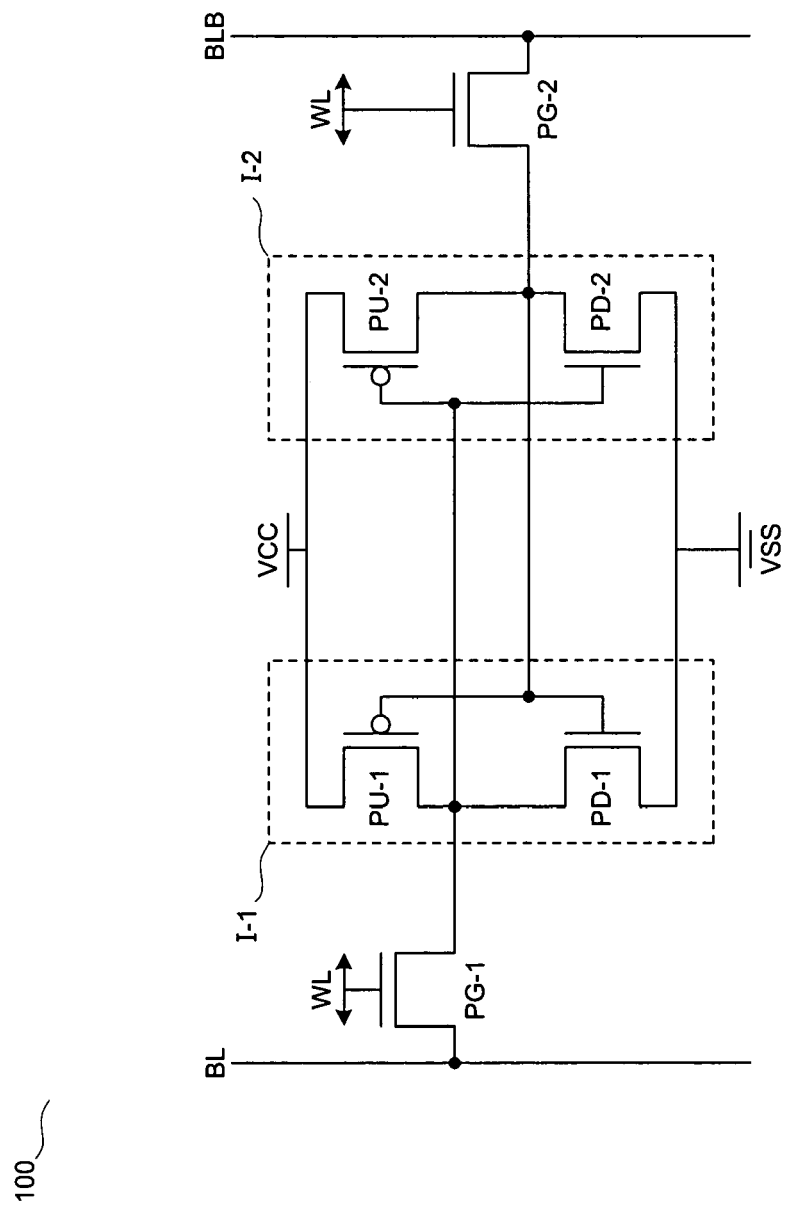
FIG. 1 illustrates a circuit diagram of a standard SRAM cell.

FIG. 1 illustrates a circuit diagram of a standard six-transistor SRAM cell 100. Cross-coupled inverters latch data written from bit line BL through a pass gate PG-1 into an inverter I-1, which includes transistors PU-1 and PD-1; and simultaneously, an inverted level, from bit line bar BLB through a pass gate PG-2 into an inverter I-2, which includes transistors PU-2 and PD-2. Stored data can be read on access lines such as a bit line BL, and simultaneously, an inverted level, on bit line bar BLB. Both of the pass gates are switched simultaneously by the word line WL.

Figure 2:
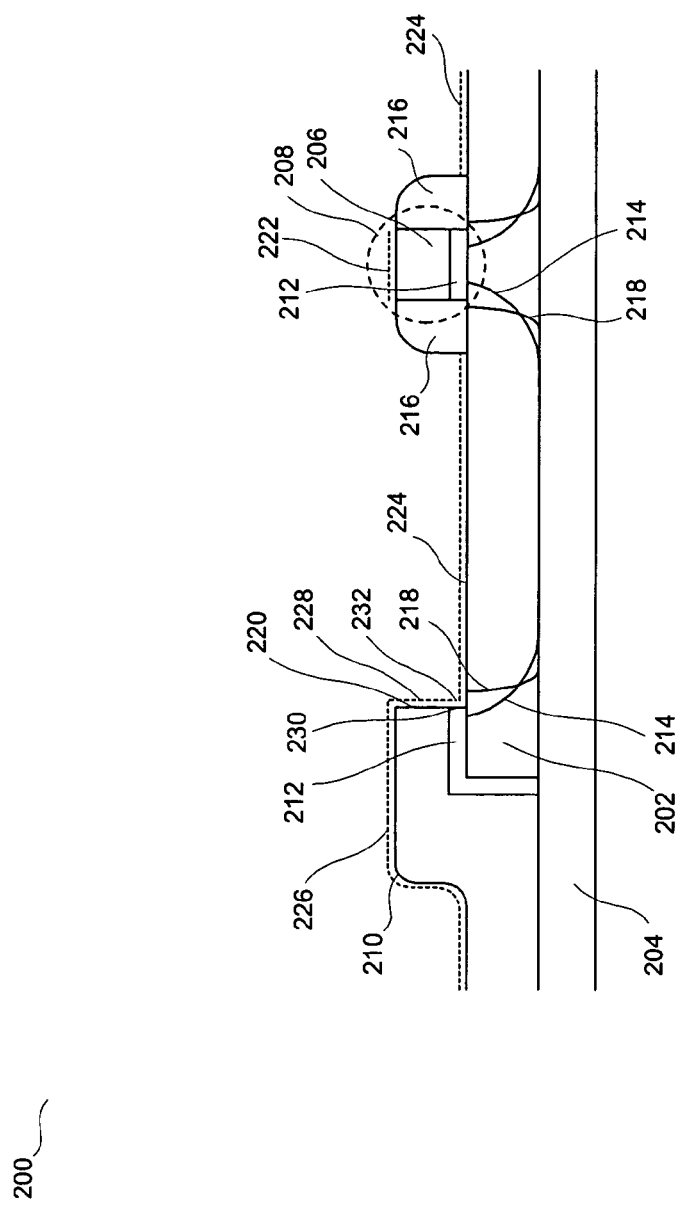
FIG. 2 illustrates a cross section of a PMOSFET and a sidewall butted contact on SOI in accordance with one example of the present invention.

FIG. 2 illustrates a cross section 200 of an SOI realization of a portion of the six-transistor SRAM in FIG. 1, in accordance with one example of the present invention. The IC components are produced in a silicon based material island 202 that reside on an insulating substrate layer 204. The silicon island 202 may have a thickness between 20 to 1500 angstroms. The poly gate layer 206 of a PMOSFET 208, and a connecting poly layer (or a gate interconnect layer) 210 are defined from a single poly layer deposited on a gate dielectric, or gate oxide 212. The gate dielectric material may comprise SiO2, SiON, oxides containing nitrogen, Ta, Al, or Hf, oxide, high K material (K>5), or any combination thereof. P-type low-nitrided doped drain is implanted into the silicon island 202 through the openings in the poly layers 206 and 210, and diffused down through the full depth of the silicon island 202 to produce the source and drain junction 214. After the sidewall spacer 216 is produced, P+ high level doping may be implanted into the silicon island 202 through the openings, and diffused down through the full depth of the silicon island 202 to produce the source and drain junction 218. A window patterned in a photoresist layer allows the sidewall spacer to be etched from a sidewall 220 of the connecting poly layer 210 in selected contact areas.

A metal (not shown), such as titanium, may be deposited on the entire top exposed surface of all illustrated structures. A high temperature process alloys the metal with all exposed silicon surfaces to produce a metal-silicide surface layer. Therefore, a metal-silicide 222 is formed on the surface of the gate poly layer 206. A metal-silicide 224 is formed on the surface of the source and drain regions. A metal-silicide 226 is formed on the surface of the connecting poly layer 210. A metal-silicide 228 is formed on the surface of the sidewall of the connecting poly layer 210. Excess unalloyed metal is then etched off. Since a metal that is selected will not alloy with silicon oxide, the remaining sidewall spacer 216 is cleared of metal. A dielectric edge portion such as a gate oxide layer edge 230 that is exposed when the sidewall spacer is etched from the sidewall of the connecting poly layer 210 may not be cleared of metal because the gap across the thickness of the gate oxide is relatively small (e.g., less than 50 angstroms). The metal-silicide may include TiSi2, CoSi2, NiSi, PtSi, WSi2, or other metal based materials such as TiN, TiW, TaN. Further, the metal-silicide surface layer may be less than 350 angstroms in thickness. In some applications, the metal-silicide surface layer provides an electrical resistance of 100 ohm/ea, or less, between the gate interconnect layer and the active region.

During the high temperature alloy process, not only does the metal diffuse into the silicon layers; but also, the silicon diffuses into the deposited metal layer, from both the single crystal silicon island 202 and the connecting poly layer 210. Metal-silicide is therefore formed in a continuous layer 232, even across the narrow gate oxide layer edge 230. Continuous layer 232 thereby bridges the gap formed by the edge of gate oxide 212, between single crystal silicon island 202 and connecting poly layer 210. Continuous layer 232 is formed by respective lateral encroachment of a silicide film formed of the silicidation of the metal layer and single crystal silicon island 202 and a silicide film formed of the silicidation of metal layer 202 and connecting poly layer 210. Continuous layer 232 thereby consists of a first silicide film that includes silicon from single crystal silicon island 202 and a second silicide film that includes silicon from connecting poly layer 210. As such, the gate oxide 212 no longer separates the silicon island 202 from the connecting poly silicon layer 210. This continuous silicide layer 232 is said to have a sidewall butted connection structure. From the perspective of an SRAM cell, this metal-silicide layer may serve as a local intra-cell connection mechanism between the pull-up P-channel metal-oxide-semiconductor field effect transistor (PMOSFET) and the pull-down NMOSFET, wherein the SOI P-active area is directly and continuously connected with the SOI N-active area.

Figure 3:
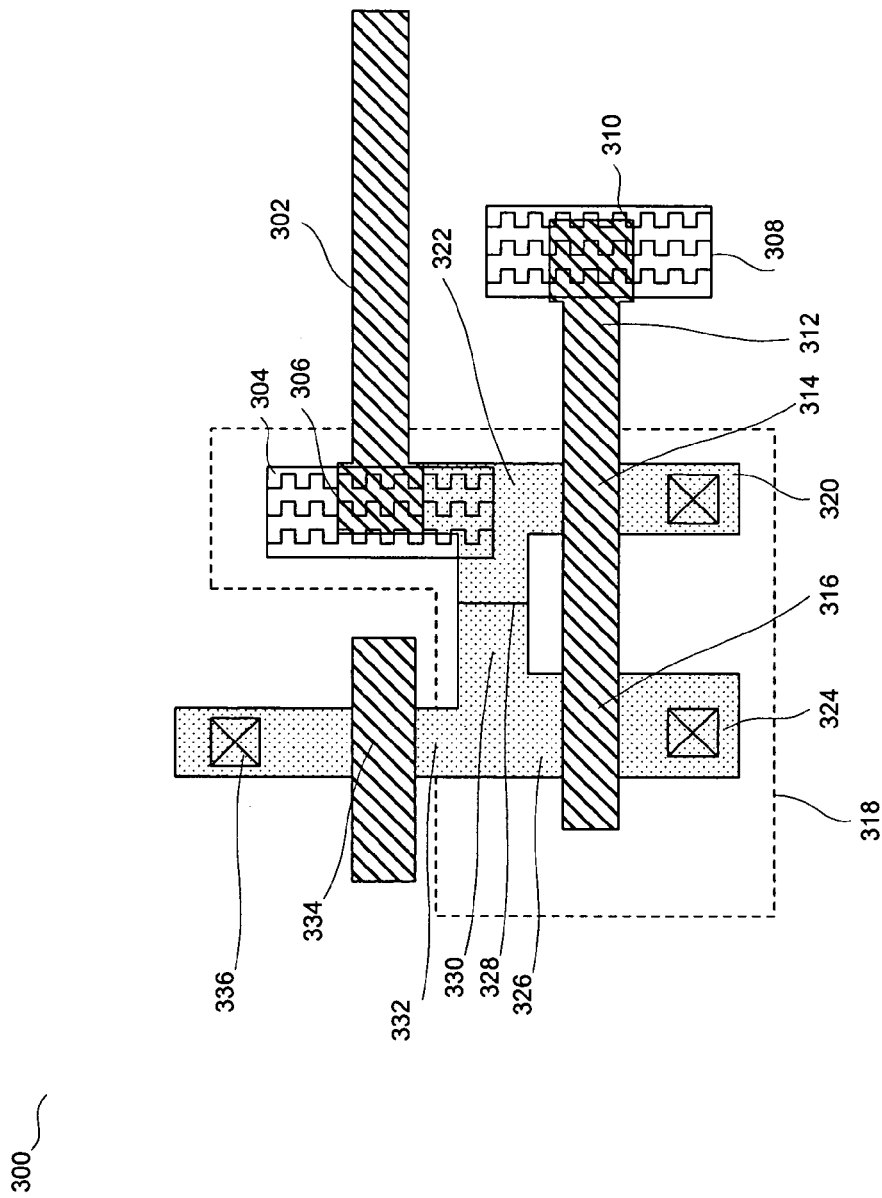
FIG. 3 illustrates a first pre-metal layout of a half SRAM cell in accordance with one example of the present invention.

FIG. 3 illustrates the first pre-metal layout 300 of a half SRAM cell in accordance with one example of the present invention. A silicided gate poly 302 form the gates of the inverter in the other half SRAM cell (not shown). An area 304 is exposed, through a window in a photoresist layer, to etch away the sidewall spacer from an edge 306, of the portion of gate poly 302 which is included. The same is true for a photoresist window 308, within which the sidewall spacer is etched from the edge 310 of a silicided gate poly 312. The silicided gate poly 312 form the gates for a PMOSFET 314 (PU-1), and an NMOSFET 316 (PD-1), of an inverter 318 (I-1).

Silicided P+ active areas include the source 320 and the drain 322 of the PMOSFET 314. Silicided N+ active areas include the source 324 and the drain 326 of the NMOSFET 316. A mask line 328 is the edge of the N-well that is implanted and diffused under the whole PMOSFET 314. N-well doping is overwhelmed everywhere except under the gate of PMOSFET 314 and, optionally, the portion of a silicided neck 330 between the P+ doped drain 322 and the mask line 328. The silicided neck 330 is the active area that may or may not be doped P-type or N-type. Doping is optional in the silicided neck 330, because the silicided surface shorts the silicided PMOSFET P+ doped drain 322 to the silicided NMOSFET N+ doped drain 326. Furthermore, the NMOSFET silicided N+ drain 326 is common with the silicided N+ source 332 of the pass gate NMOSFET 334 (PG-1), which has silicided N+ drain 336.

The connection, by the silicided neck 330, between the drains 322 and 326 obviates two contacts, one to each drain, that are necessary in previous technologies. The two drains 322 and 326, connected by the silicided neck 330, form the storage node of the inverter 318. The storage node is connected to the silicided gate poly 302 by the sidewall butted contact formed on the edge 306 of the silicided gate poly 302. This is the sidewall butted contact 232 as illustrated in FIG. 2. By using the silicided neck 330, which helps form the storage node of the inverter 318, and the sidewall butted contact, which connects the aforesaid storage node to the silicided gate poly 302, where an area-efficient connection structure is provided. Two metal drain contacts with a metal routing are obviated in the storage node, and a tungsten-plug butted contact, or a pair of contacts with a metal routing, is replaced by the simpler, area-saving sidewall butted contact with the metal-silicide layer.

Figure 4:
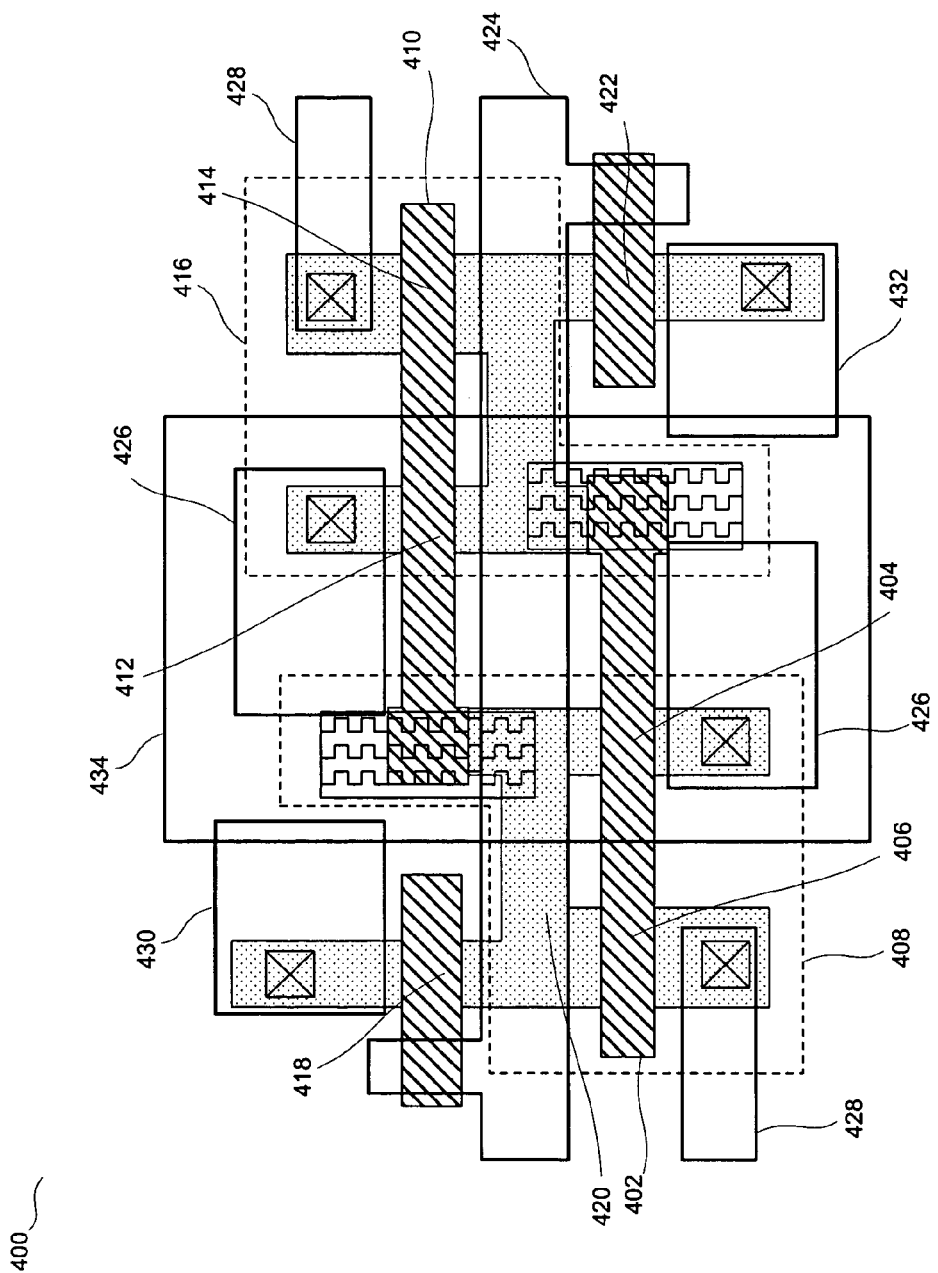
FIGS. 4–5 illustrate a first layout of the standard SRAM cell in accordance with one example of the present invention.

FIG. 4 illustrates the first layout 400 of an SRAM cell in accordance with one example of the present invention. This layout 400 takes advantage of the dense contact structures as shown in FIGS. 2 and 3. The inverter and pass gate shown in FIG. 3 are shown again with the addition of the symmetrical inverter and pass gate necessary to produce a complete SRAM cell. Poly gate layer 402 forms the gates of a PMOSFET 404 (PU-1) and an NMOSFET 406 (PD-1) of the inverter 408 (I-1). Poly gate layer 410 forms the gates of a PMOSFET 412 (PU-2) and an NMOSFET 414 (PD-2) of the inverter 416 (I-2). A pass gate 418 (PG-1) connects to a node 420 of the inverter 408. A transistor 422 (PG-2)

connects to a node 422 of the inverter 416. Metal Layer 1, as illustrated by bold lines, is used as a strap 424 for the word line, and the landing pads 426, 428, 430 and 432 for VCC, VSS, bit line, and bit line bar, respectively. An N-well 434 applies to both PMOSFETs 404 and 412.

Figure 5:
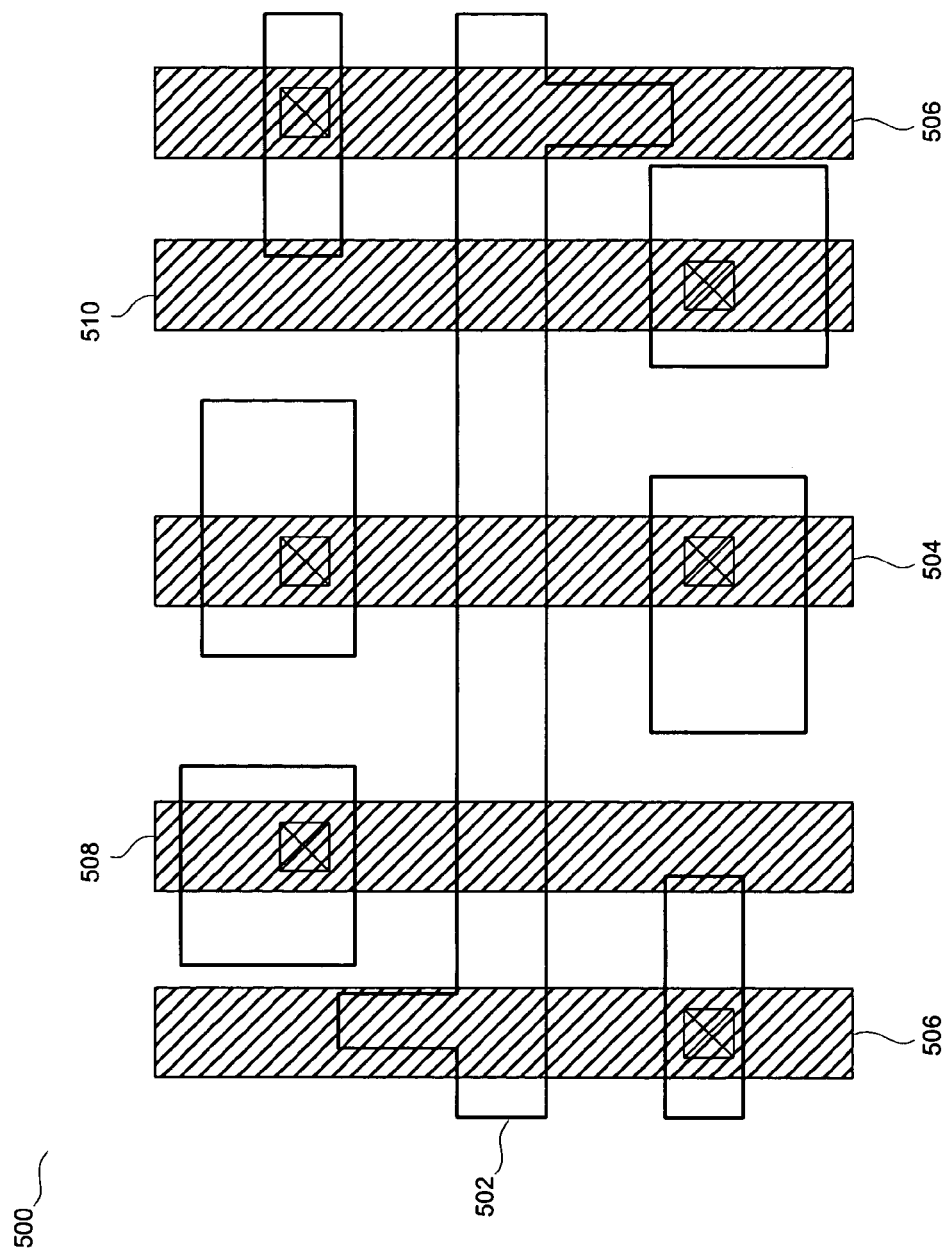

FIG. 5 illustrates a first metal layer layout 500 that corresponds to the first layout 400. The first metal layer layout 500 includes Metal Layer 1, which in turn includes a local word line 502, and the landing pads as shown in FIG. 4, and Metal Layer 2, which in turn includes VCC 504, VSS 506, bit line 508, and bit line bar 510. As can be seen, the two metal layers are arranged in a substantial perpendicular fashion. On Metal Layer 2, the access lines 508 and 510 are interposed between the power supply lines 504 and 506 for noise shielding purposes.

Figure 6:
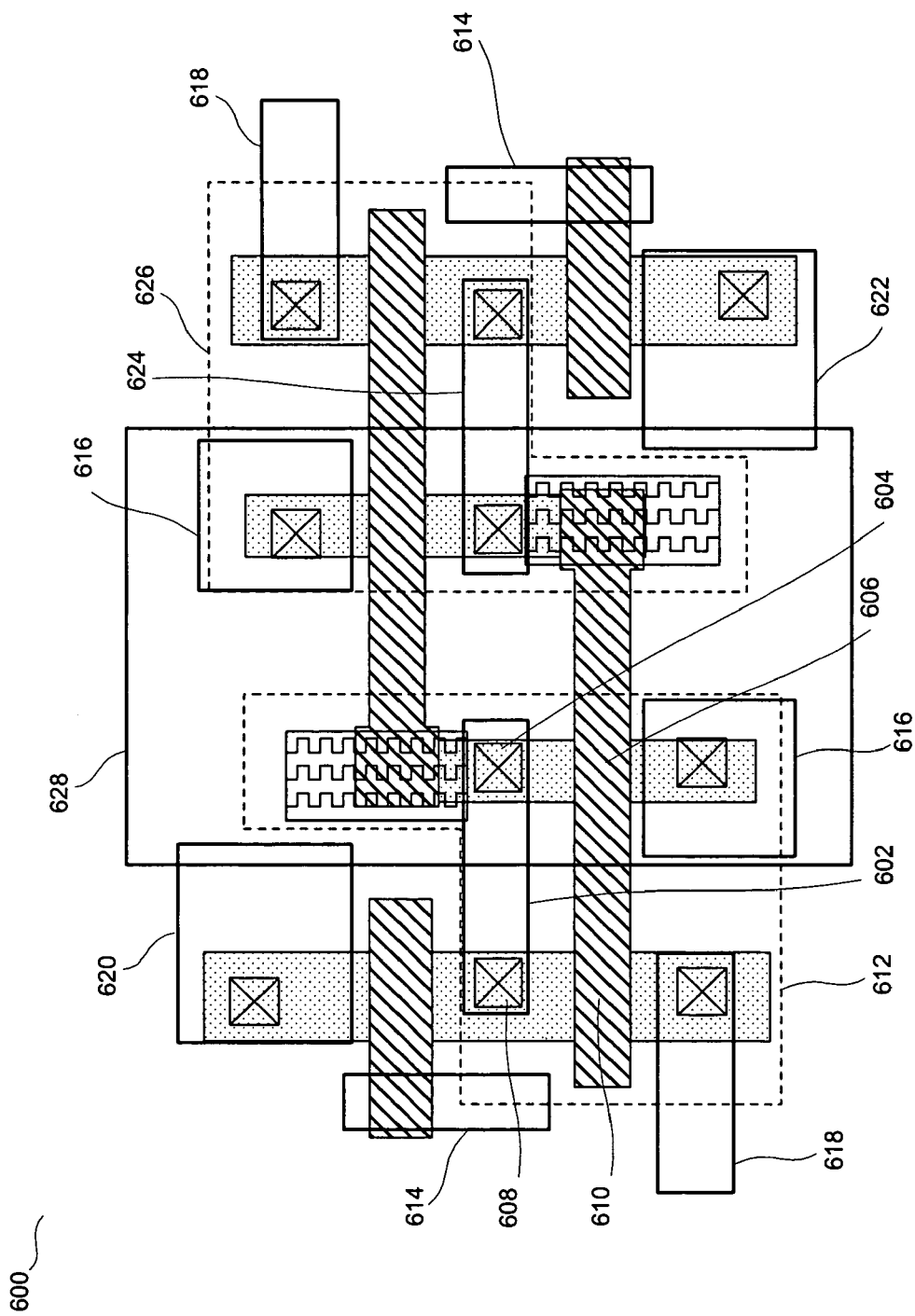
FIGS. 6–7 illustrate a second layout of the standard SRAM cell in accordance with one example of the present invention.

FIG. 6 illustrates the second layout 600 of an SRAM cell in accordance with one example of the present invention. The second layout 600 takes advantage of the sidewall butted contacts, but not the silicided active region connection as shown in FIGS. 2 and 3. Metal Layer 1 is used as a connection 602 between the drain 604 of a PMOSFET 606 (PU-1) and the drain 608 of an NMOSFET 610 (PD-1) to complete the storage node of the inverter 612 (I-1). Metal Layer 1 is also used for a landing pad 614 for the word line, and the landing pads 616, 618, 620 and 622 for VCC, VSS, bit line and bit line bar, respectively. A connection 624 is used in the same way in an inverter 626 (I-2) as the connection 602 in the inverter 612.

Figure 7:
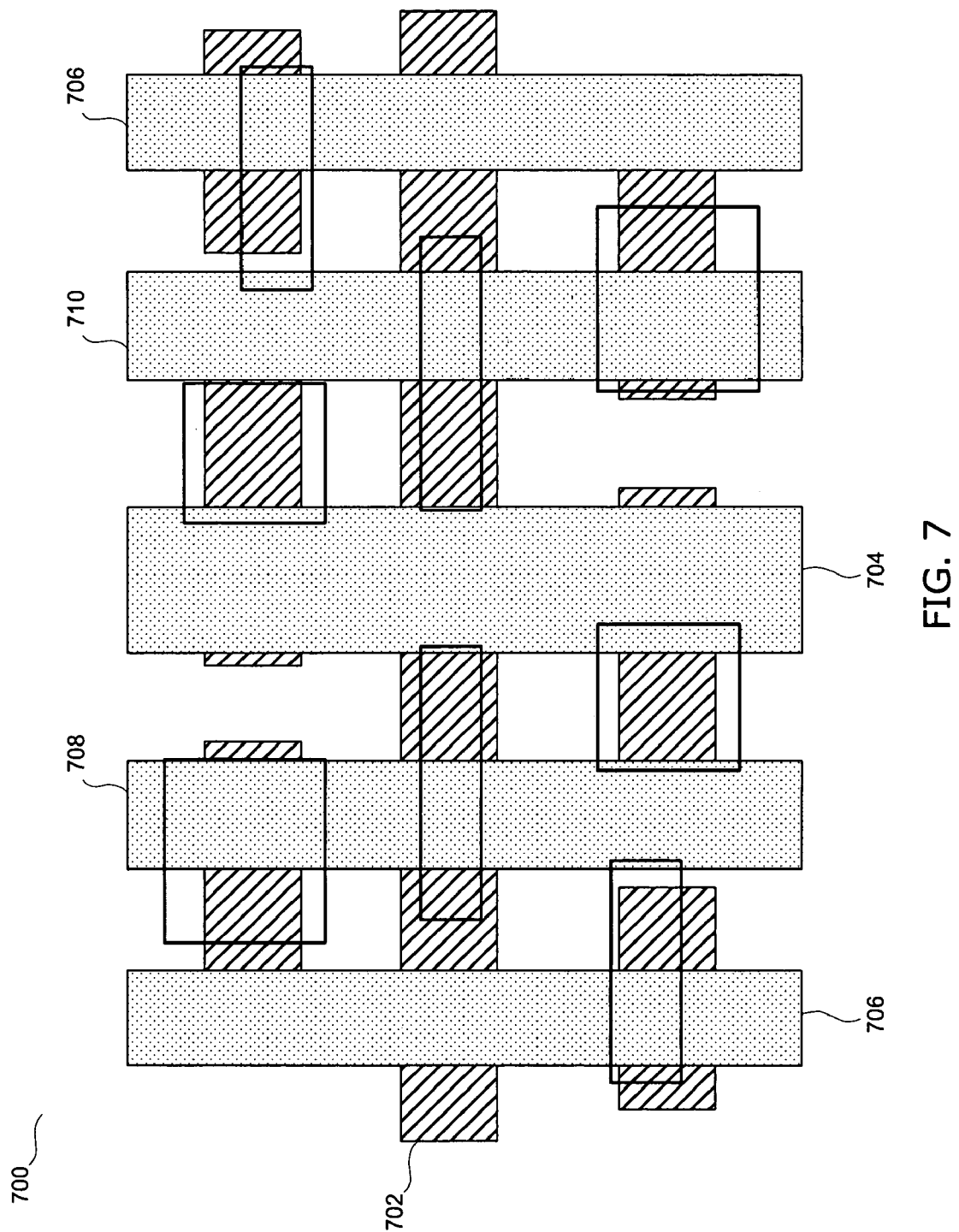

FIG. 7 illustrates a second metal layer layout 700 that corresponds to the second layout 600. The second metal layer layout 700 includes Metal Layer 2, which runs parallel to gate poly as a global word line 702, and in blocks as vertical connection through vias between Metal Layer 1 and Metal Layer 3. The Metal Layer 2 is primarily used for wordline metal strap and landing pads for the power supply lines and/or the access lines. The second metal layer layout 700 also includes Metal Layer 1, as described earlier, and Metal layer 3, which is shown running perpendicular to gate poly as straps 704 and 706 for VCC and VSS, a bit line 708, and a bit line bar 710.

Figure 8:
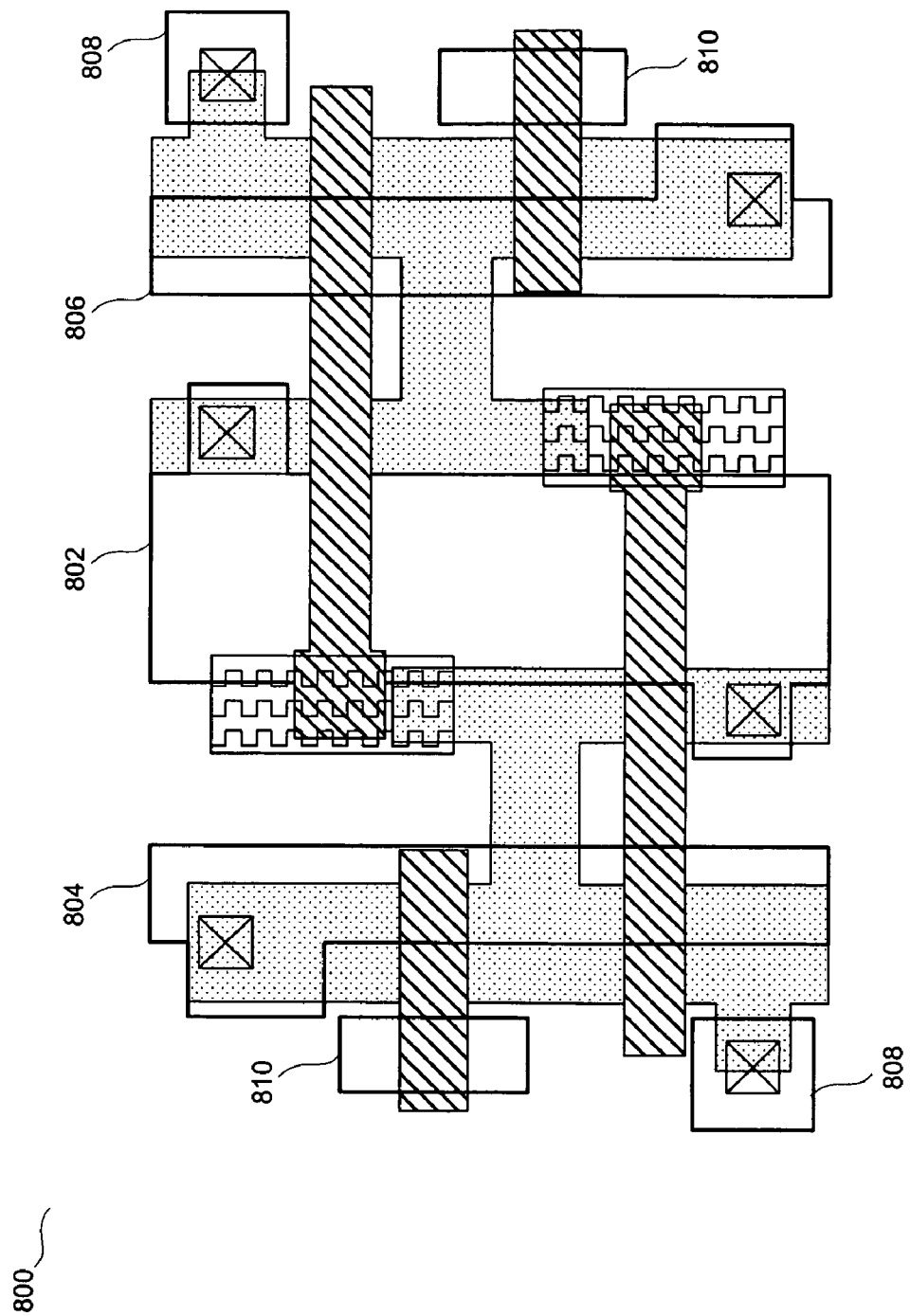
FIGS. 8–9 illustrate a third layout of the standard SRAM cell in accordance with one example of the present invention.

FIG. 8 illustrates the third layout 800 of an SRAM cell in accordance with one example of the present invention. The third layout 800 takes advantage of both of the dense contact structures as shown in FIGS. 2 and 3. The active components are the same as in FIG. 4. Metal Layer 1 is shown running perpendicular to gate poly as a strap 802 for VCC, a bit line 804, and a bit line bar 806, and as landing pads for 808 and 810 for VSS and the word line, respectively.

Figure 9:
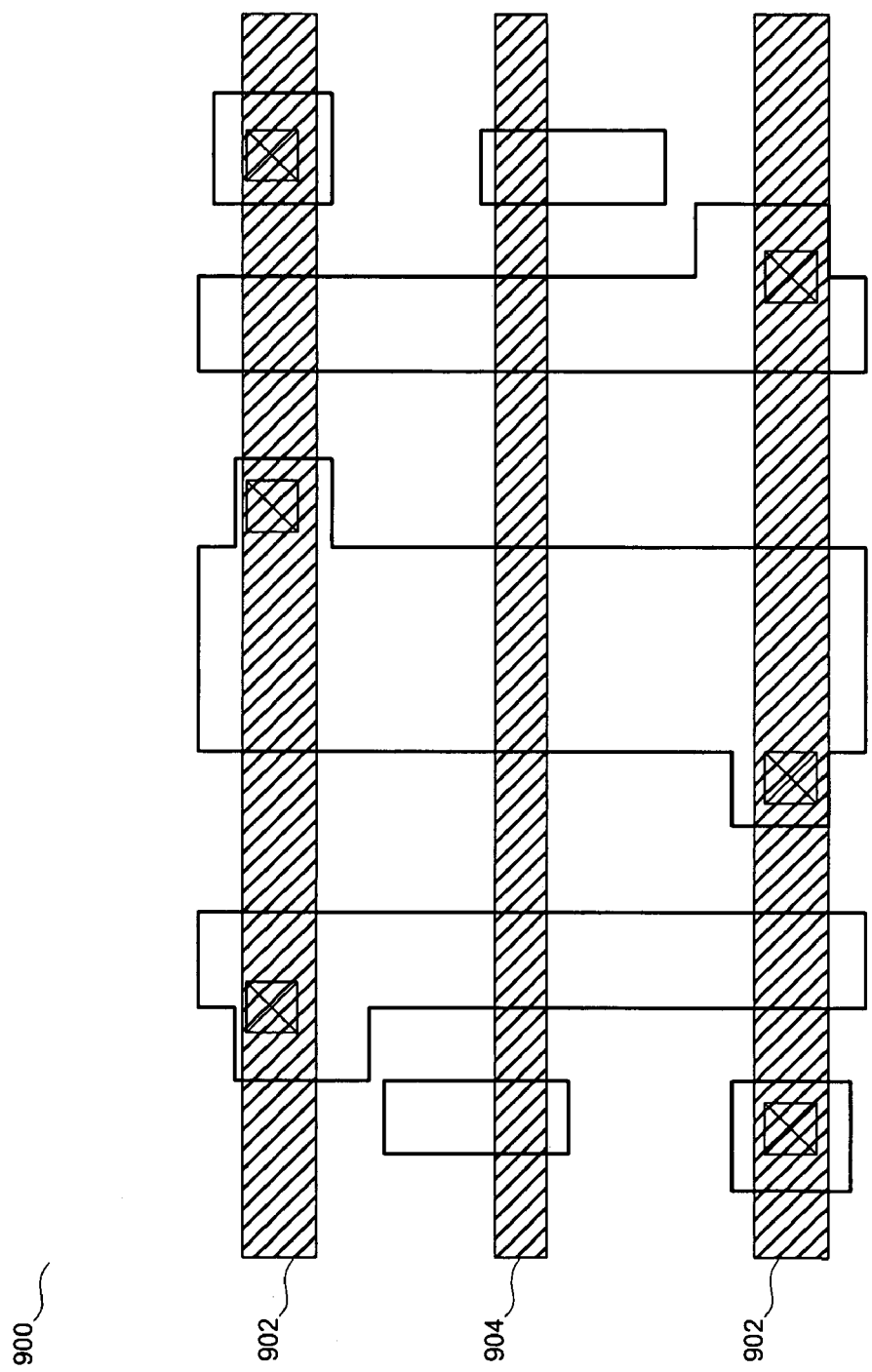

FIG. 9 illustrates a third metal layer layout 900 that corresponds to the third layout 800. The third metal layer layout 900 includes Metal Layer 1, as described in FIG. 8, and Metal Layer 2, which includes straps 902 and 904 for VSS and the word line, respectively.

It is also understood that the inverter gate poly patterns can be extended so that they overlap the drains of both the NMOSFET and the PMOSFET. As such, the sidewall butted contacts can be formed for directly connecting the drains of the transistors of a first inverter to the gates of the transistors of a second inverter in the SRAM cell.

Figure 10A:
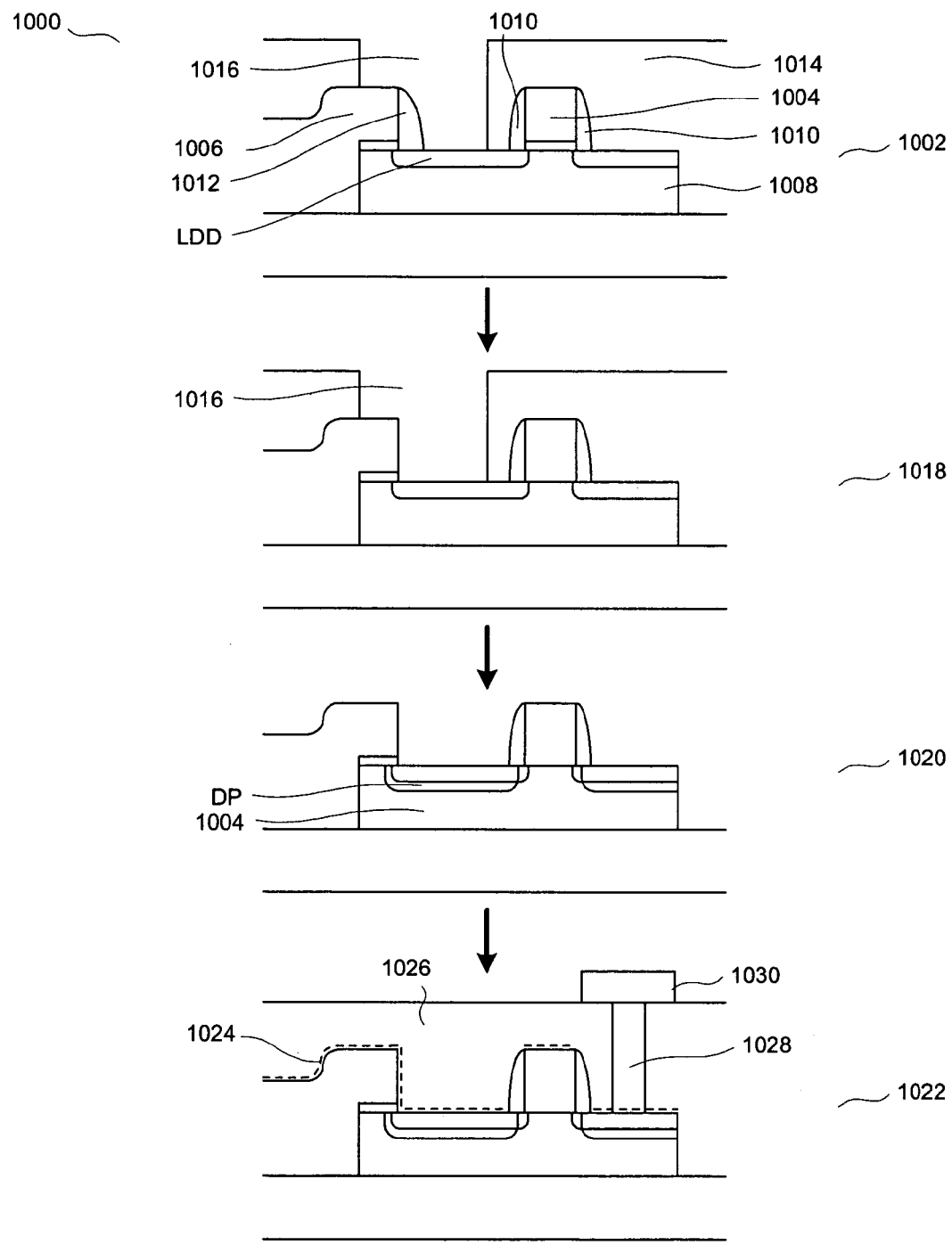
FIG. 10A presents a process flow illustrating the processing steps in a single-photoresist scenario in accordance with one example of the present invention.

FIG. 10A presents a process flow 1000 illustrating the processing steps in a single-photoresist scenario. In step 1002, a MOS transistor 1004 and a poly interconnect 1006 are formed on an SOI substrate 1008. A low-doped drain (LDD) is then implanted into the SOI substrate 1008. Sidewall spacers 1010 are formed on the sides of the MOS transistor 1004, and a sidewall spacer 1012 is formed on the side of the poly interconnect 1006. After a photoresist layer 1014 is coated onto the above-mentioned structure, a photoresist window 1016 is developed. In step 1018, the sidewall spacer 1010 is etched away through the photoresist window 1016. In step 1020, after the photoresist layer 1014 is removed, a dopant is implanted into the SOI substrate 1004. The dopant DP may be N+ or P+. In step 1022, a layer of metal-silicide silicide 1024 is first formed on all the exposed silicon surfaces. The silicide layer may have a thickness of less than 350 angstroms. A layer of interlayer dielectric 1026 is then deposited and planarized. After a via 1028 is etched into the interlayer dielectric 1026, Metal Layer 1 is deposited onto the interlayer dielectric 1026, thereby filling the via 1028. Metal Layer 1 is then patterned, as shown by a block 1030. The filled via 1028 connects Metal Layer 1 to the silicided surface of the source of the MOS transistor 1004.

Figure 10B:
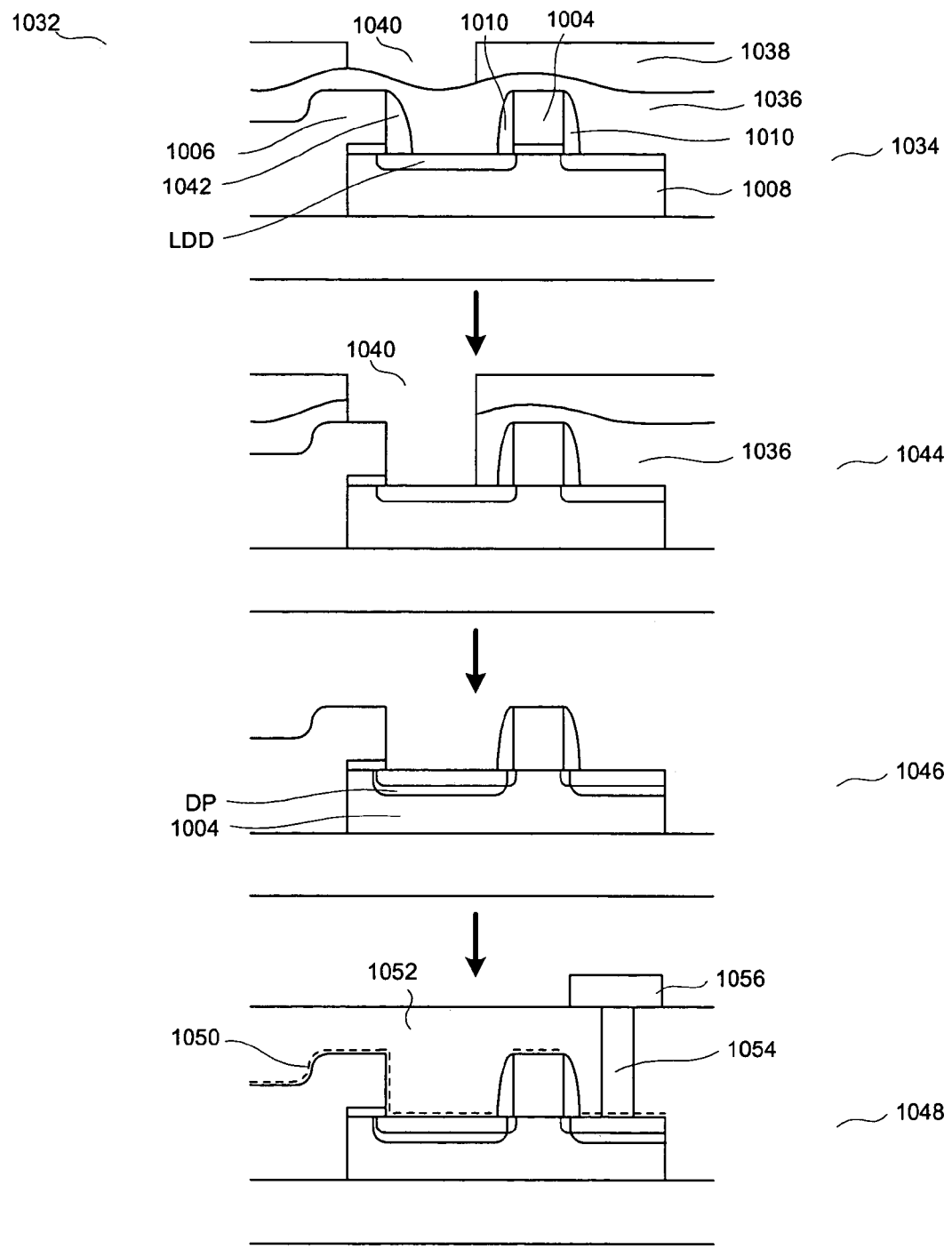
FIG. 10B presents a process flow illustrating the processing steps in a double-photoresist scenario in accordance with one example of the present invention.

FIG. 10B presents a process flow 1032 illustrating the processing steps in a double-photoresist scenario. Similar to the process flow 1000 as illustrated in FIG. 10A, the MOS transistor 1004, and the poly interconnect 1006 are formed on the SOI substrate 1008 in step 1034. The low-doped drain LDD is then implanted into the SOI substrate 1008. Sidewall spacers 1010 are formed on the sides of the MOS transistor 1004. Then, a first photoresist layer 1036 is deposited. A second photoresist layer 1038 is deposited on top of the first photoresist layer 1036, and then a photoresist window 1040 is developed. This photoresist window 1040 will later be used to etch away the sidewall spacer 1042. In step 1044, the photoresist window 1040 is developed downwards into the first photoresist layer 1036, thereby exposing the sidewall spacer 1042, which is subsequently removed. In step 1046, after the photoresist layers 1036 and 1038 are removed, the dopant DP is implanted into the SOI substrate 1004. The dopant DP may be N+ or P+. In step 1048, metal-silicide 1050 is first formed on all the exposed silicon surfaces. Interlayer dielectric 1052 is then deposited and planarized. After a via 1054 is etched into the interlayer dielectric 1052, Metal Layer 1 is deposited onto the interlayer dielectric 1052, thereby filling the via 1054. Metal Layer 1 is then patterned, as shown by the block 1056. The filled via 1054 connects Metal Layer 1 to the silicided surface of the source of the MOS transistor 1004.

Figure 10C:
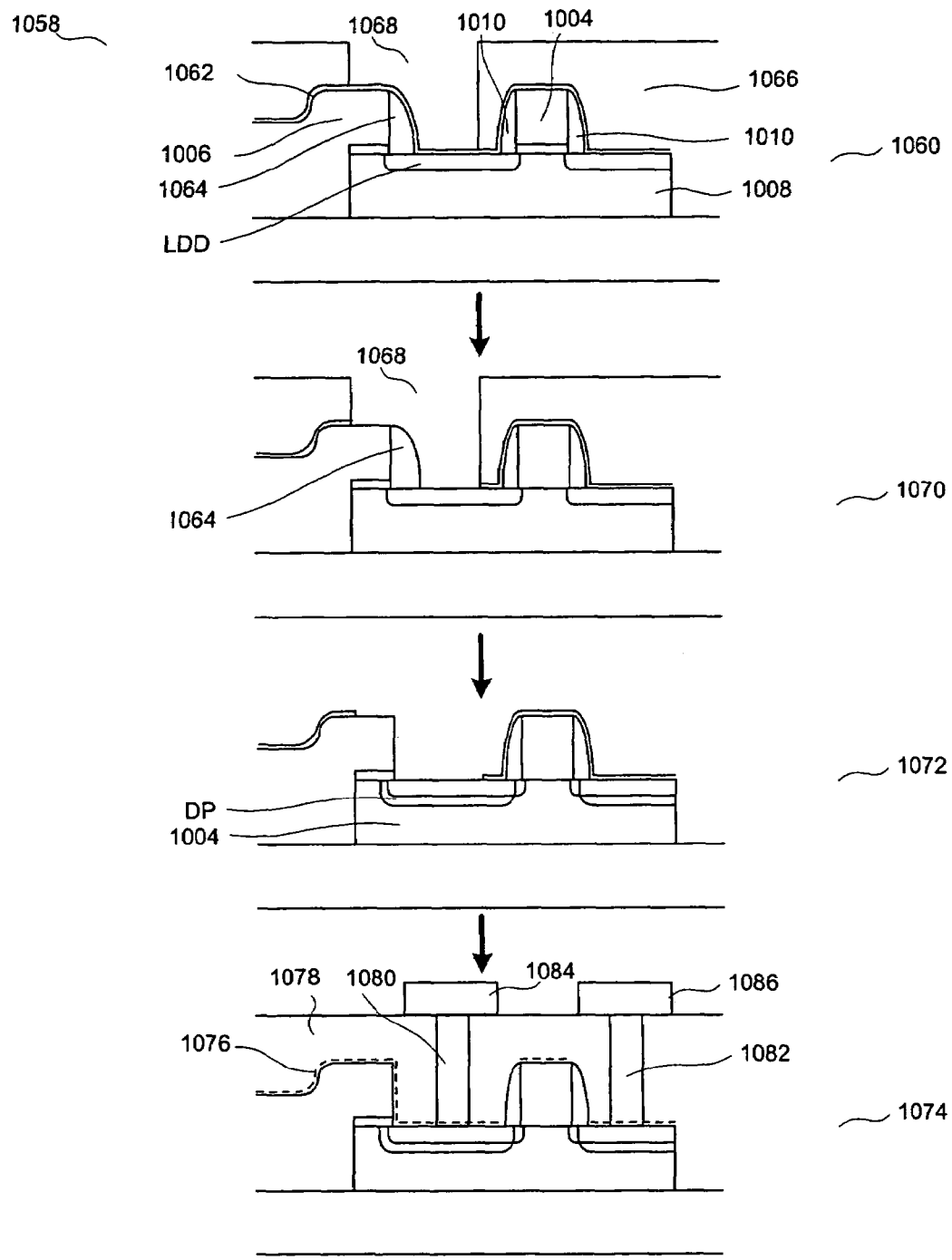
FIG. 10C presents a process flow illustrating the processing steps involving an anti-reflective coating in accordance with one example of the present invention.

FIG. 10C presents a process flow 1058 illustrating the processing steps involving an anti-reflective coating (ARC). Similar to the process flow 1000 as illustrated in FIG. 10A, the MOS transistor 1004, and the poly interconnect 1006 are formed on the SOI substrate 1008 in step 1060. The low-doped drain LDD is then implanted into the SOI substrate 1008. Sidewall spacers 1010 are formed on the sides of the MOS transistor 1004. In step 1060, ARC layer 1062 is deposited on all surfaces, including the sidewall spacer 1064. Photoresist layer 1066 is then deposited on top of the ARC layer 1062, after which a photoresist window 1068 is developed. In step 1070, the ARC layer 1062 that is exposed in photoresist window 1068 is etched away, thereby exposing the sidewall spacer 1064. In step 1072, after the sidewall spacer 1064 is etched away, the photoresist layer 1066 is removed. Then, the dopant DP is implanted into the SOI substrate 1004. The dopant DP may be N+ or P+. In step 1074, metal-silicide 1076 is first formed on all the exposed silicon surfaces. Interlayer dielectric 1078 is then deposited and planarized. After vias 1080 and 1082 are etched into the interlayer dielectric 1078, Metal Layer 1 is deposited onto the interlayer dielectric 1078, thereby filling the vias 1080 and 1082. Metal Layer 1 is then patterned, as shown by blocks 1084 and 1086. The filled vias 1080 and 1082 connect Metal Layer 1, respectively, to the silicided surfaces of the drain and source of the MOS transistor 1004.

The above invention provides many different embodiments, or examples, for implementing different features of the invention. Specific examples of components, and processes are described to help clarify the invention. These are, of course, merely examples and are not intended to limit the invention from that described in the claims.

Although illustrative embodiments of the invention have been shown and described, other modifications, changes, and substitutions are intended in the foregoing invention. Accordingly, it is appropriate that the appended claims be construed broadly, and in a manner consistent with the scope of the invention, as set forth in the following claims.

What is claimed is:

1. An SRAM cell formed on an insulator substrate, the cell comprising:
   at least one active region formed on the insulator substrate and with a continuous silicide layer formed thereon serving as an intra-cell connection layer connecting at least a drain node of a PMOS transistor to a drain node of an NMOS transistor formed on the insulator substrate, the two transistors forming a first inverter;
   said continuous silicide layer further forming a sidewall butted connection structure used in conjunction with a gate interconnect layer and connecting the drain nodes of the transistors of the first inverter to gates of at least two transistors of a second inverter,
   wherein the continuous silicide layer consists of a first silicide film formed of silicon from the active region and a second silicide film formed of silicon from the gate interconnect layer.

2. The cell of claim 1 wherein the active region further connects to a source node of at least one pass gate.

3. The cell of claim 2 wherein the pass gate's drain node is connected to an access line.

4. The cell of claim 1 further comprising a first metal layer for forming wordline metal straps and landing pads for power supply lines and access lines.

5. The cell of claim 4 further comprising a second metal layer for forming power supply lines and access lines.

6. The cell of claim 5 wherein the access lines are interposed between the power supply lines.

7. The cell of claim 4 wherein lines on the first and second metal layers are arranged in a substantially perpendicular fashion.

8. An SRAM cell formed on an insulator substrate, the cell comprising:
   a first inverter having a first PMOS transistor and a first NMOS transistor;
   a second inverter having a second PMOS transistor and a second NMOS transistor; and
   a sidewall butted connection structure used in conjunction with a gate interconnect layer for connecting drain nodes of the transistors of the first inverter formed on an active region disposed on the insulator substrate, to gates of the two transistors of the second inverter,
   wherein the sidewall butted connection structure is a continuous silicide layer including a junction covering a dielectric edge portion between the active region and the gates of the two transistors and consists of a first silicide film formed of silicon from the active region and a second silicide film formed of silicon from the gates.

9. The cell of claim 8 further comprising a first metal layer for forming landing pads for at least one wordline and at least one power supply line or access line.

10. The cell of claim 9 further comprising a second metal layer for forming at least one wordline metal strap and landing pads for at least one power supply line or access line.

11. The cell of claim 10 further comprising a third metal layer for forming power supply lines and access lines.

12. The cell of claim 11 wherein the access lines are interposed between the power supply lines.

13. The cell of claim 8 wherein the first metal layer is also used for forming a connection between the drain nodes of the two transistors of the first or second inverter.

14. The cell of claim 8 further comprising at least one active region with a silicide layer formed thereon serving as an intra-cell connection layer connecting drain nodes of the transistors of the first inverter.

15. The cell of claim 8 wherein the sidewall butted connection structure is electrically connected to a source node of a pass gate.

16. The cell of claim 8 further comprising a first metal layer for forming at least one power supply line and at least one access line.

17. The cell of claim 16 wherein the first metal layer is used for forming landing pads for at least one wordline, or landing pads for at least one power supply line.

18. The cell of claim 16 further comprising a second metal layer for forming at least one wordline metal strap and at least one power supply line.

* * * * *

UNITED STATES PATENT AND TRADEMARK OFFICE
CERTIFICATE OF CORRECTION

| | | |
|---|---|---|
| PATENT NO. | : 7,187,036 B2 | Page 1 of 1 |
| APPLICATION NO. | : 10/815201 | |
| DATED | : March 6, 2007 | |
| INVENTOR(S) | : Jhon Jhy Liaw | |

It is certified that error appears in the above-identified patent and that said Letters Patent is hereby corrected as shown below:

Column 3, line 15, after "Hf," insert -- nitrided --.

Column 3, line 16, delete "low-nitrided doped" and insert therefore -- low-doped --.

Column 6, line 9, delete "metal-silicide silicide" and insert therefore -- metal-silicide --.

Signed and Sealed this

Twenty-fourth Day of July, 2007

JON W. DUDAS
*Director of the United States Patent and Trademark Office*